(12) United States Patent
Youn et al.

(10) Patent No.: US 10,748,975 B2
(45) Date of Patent: Aug. 18, 2020

(54) DISPLAY DEVICE

(71) Applicant: LG Display Co., Ltd., Seoul (KR)

(72) Inventors: Wooram Youn, Paju-si (KR);
Jaehyung Yu, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/521,984

(22) Filed: Jul. 25, 2019

(65) Prior Publication Data
US 2020/0035769 A1 Jan. 30, 2020

(30) Foreign Application Priority Data

Jul. 27, 2018 (KR) .......................... 10-2018-0088111

(51) Int. Cl.
*H01L 27/32* (2006.01)
*G02B 27/01* (2006.01)
*G06F 3/01* (2006.01)
*H01L 51/52* (2006.01)

(52) U.S. Cl.
CPC ...... *H01L 27/3246* (2013.01); *G02B 27/0172* (2013.01); *G06F 3/011* (2013.01); *H01L 27/326* (2013.01); *H01L 27/3213* (2013.01); *H01L 51/5218* (2013.01); *H01L 51/5237* (2013.01); *H01L 51/5271* (2013.01); *H01L 51/5275* (2013.01); *G02B 2027/011* (2013.01); *G02B 2027/0178* (2013.01)

(58) Field of Classification Search
CPC ............. H01L 27/3246; H01L 51/5271; H01L 27/326; H01L 51/5275; H01L 51/5218
See application file for complete search history.

(56) References Cited

U.S. PATENT DOCUMENTS

| 9,502,480 B2 * | 11/2016 | Kim ................... H01L 27/3246 |
| 9,698,204 B2 * | 7/2017 | Kamura ............. H01L 51/0096 |
| 9,774,011 B2 | 9/2017 | Choi et al. |
| 2004/0160165 A1 * | 8/2004 | Yamauchi ........... H01L 27/3246 313/498 |
| 2017/0179437 A1 | 6/2017 | Kim et al. |
| 2019/0115404 A1 * | 4/2019 | Moon ................ H01L 27/3246 |

FOREIGN PATENT DOCUMENTS

| KR | 10-2016-0027608 A | 3/2016 |
| KR | 10-2017-0074312 A | 6/2017 |

* cited by examiner

*Primary Examiner* — William Coleman
(74) *Attorney, Agent, or Firm* — Morgan, Lewis & Bockius LLP

(57) ABSTRACT

A display device includes a substrate with a first subpixel area and a second subpixel area adjacent to one side of the first subpixel area; an insulating layer on the substrate having a first recessed portion on the first subpixel area, a second recessed portion on the second subpixel area and a convex portion between the first recessed portion and the second recessed portion; a reflective electrode on the insulating layer including first and second reflective electrodes on the first and second recessed portions, respectively; a first electrode including a first sub electrode on the first reflective electrode and a second sub electrode on the second reflective electrode; an organic light emitting layer on the first electrode; a bank provided between the first subpixel area and the second subpixel area while covering an end of the first electrode; a second electrode on the organic light emitting layer; and a light path change structure on the second electrode while being overlapping the bank.

20 Claims, 8 Drawing Sheets

DISPLAY DEVICE

BACKGROUND

Technical Field

The present disclosure relates to a display device displaying an image.

Description of the Related Art

With the advancement of the information age, the demand for a display device for displaying an image has increased with various forms. Therefore, various types of display devices such as a liquid crystal display (LCD) device, a plasma display panel (PDP) display device, and an organic light emitting display (OLED) device have been used.

Among the display devices, the organic light emitting display device is a self-light emitting device, and has advantages in that a viewing angle and a contrast ratio are more excellent than those of the liquid crystal display (LCD) device. Also, since the organic light emitting display device does not require a separate backlight, it is advantageous that the organic light emitting display device is able to be thin and lightweight and has low power consumption. Furthermore, the organic light emitting display device has advantages in that it may be driven at a low direct current voltage, has a fast response speed, and especially has a low manufacturing cost.

Recently, a head mounted display (HMD) including such an organic light emitting display device has been developed. The head mounted display is a glasses type monitor device of virtual reality (VR), which forms a focal point on a close distance in front of eyes of a user who wears the HMD in glasses or helmet type.

On the other hand, the organic light emitting display device has a problem in that image distortion occurs because light from an organic light emitting layer is partially spread to the outside without being concentrated on a center portion of a corresponding pixel or light spread is generated due to interference between adjacent pixels. Such a problem occurs more seriously in case of a head mounted display including an organic light emitting display device. Therefore, studies for a head mounted display with ultra-high resolution that can prevent image distortion have been actively ongoing.

SUMMARY

Accordingly, embodiments of the present disclosure are directed to a display device that substantially obviates one or more of the problems due to limitations and disadvantages of the related art.

An aspect of the present disclosure is to provide a display device that can prevents image distortion or light spread from occurring.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a substrate provided with a first subpixel area and a second subpixel area adjacent to one side of the first subpixel area, an insulating layer provided on the substrate and provided with a first recessed portion on the first subpixel area, a second recessed portion on the second subpixel area and a convex portion between the first recessed portion and the second recessed portion, a reflective electrode provided on the insulating layer, including a first reflective electrode provided on the first recessed portion and a second reflective electrode provided on the second recessed portion, a first electrode including a first sub electrode provided on the first reflective electrode and a second sub electrode provided on the second reflective electrode, an organic light emitting layer provided on the first electrode, a bank provided between the first subpixel area and the second subpixel area while covering an end of the first electrode, a second electrode provided on the organic light emitting layer, and a light path change structure arranged on the second electrode while being overlapped with the bank.

In the display device according to the present disclosure, as the light path change structure is provided on the second electrode overlapped with the bank, a light path is changed to prevent light emitted from a subpixel area from being spread to an adjacent subpixel area, whereby image distortion and light spread of a subpixel area for emitting light may be avoided.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
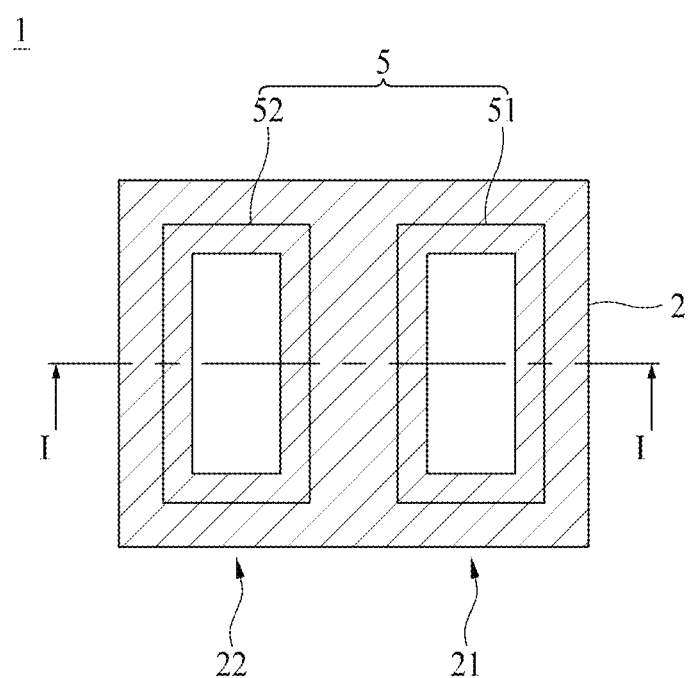
FIG. 1 is a brief plane view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first", "second", etc. may be used herein to describe various elements, these elements should not be limited by these terms. These terms are only used to partition one element from another. Therefore, a first element described hereinafter could be termed a second element.

In describing elements of the present disclosure, the terms "first", "second", etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element, and unless specially mentioned, a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the embodiments of the display device according to the present disclosure will be described in detail with reference to the accompanying drawings. Wherever possible, the same reference numbers will be used throughout the drawings to refer to the same or like parts.

Figure 2:
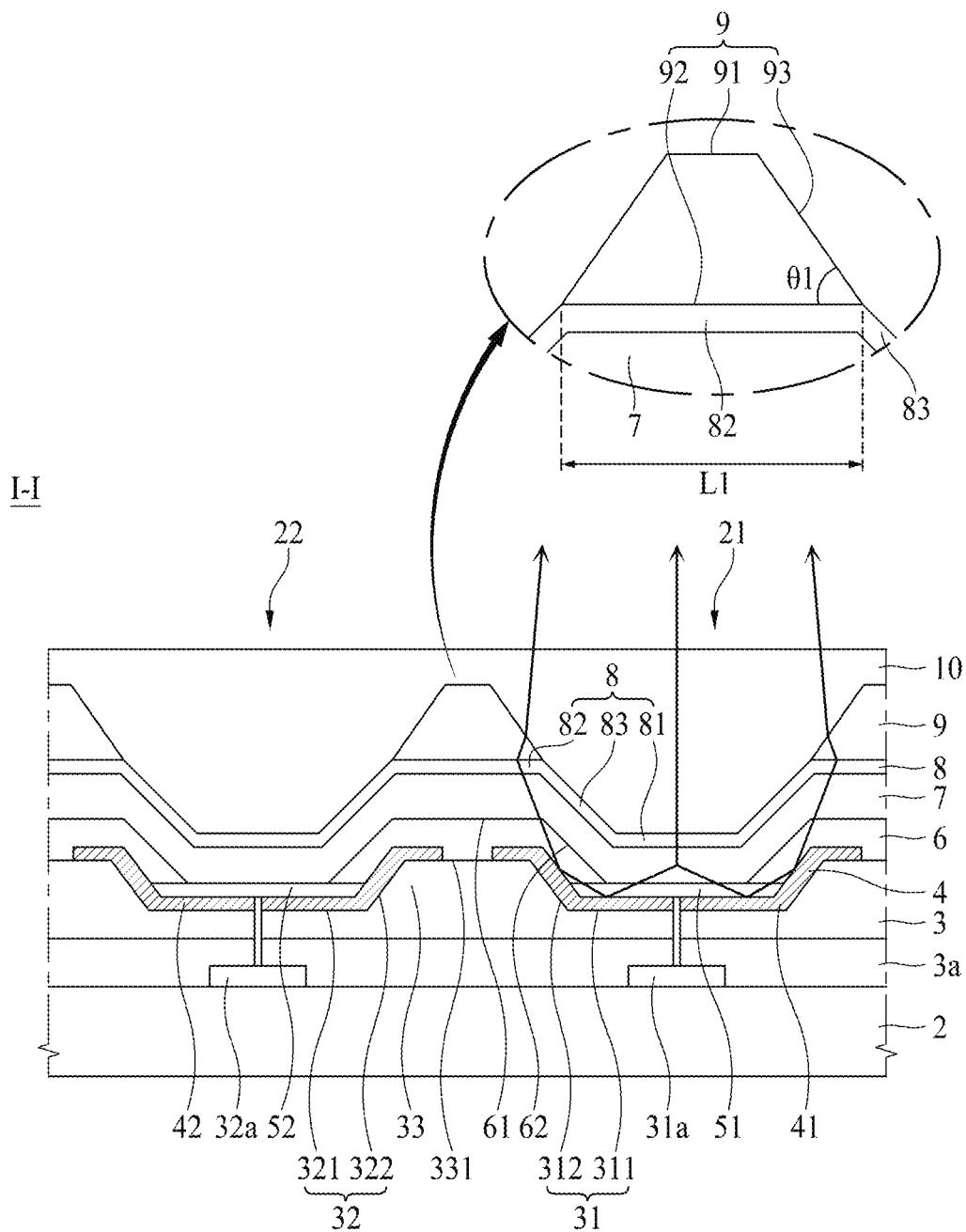
FIG. 2 is a brief cross-sectional view illustrating line I-I shown in FIG. 1.

FIG. 1 is a brief plane view illustrating a display device according to one embodiment of the present disclosure, and FIG. 2 is a brief cross-sectional view illustrating line I-I shown in FIG. 1.

Referring to FIGS. 1 and 2, the display device 1 according to one embodiment of the present disclosure comprises a substrate 2, a circuit element layer 3a, an insulating layer 3, a reflective electrode 4, a first electrode 5, a bank 6, an organic light emitting layer 7, a second electrode 8, a light path change structure 9, and an encapsulation layer 10.

The substrate 2 may be a semiconductor substrate such as a plastic film, a glass substrate, or a silicone.

The substrate 2 may include a first subpixel area 21 and a second subpixel area 22. The second subpixel area 22 according to one example may be arranged to be adjacent to one side of the first subpixel area 21.

Referring to FIGS. 1 and 2, the first subpixel area 21 and the second subpixel area 22 may emit light with various colors including white.

Each of the first subpixel area 21 and the second subpixel area 22 may include an organic light emitting diode provided with a reflective electrode 4, a first electrode 5, an organic light emitting layer 7, and a second electrode 8.

A circuit element layer 3a is arranged on one surface of the substrate 2. The circuit element layer 3a may include a plurality of transistors 31a and 32a, gate lines, data lines, subpixels. The subpixels are arranged on an area defined by a crossing structure of the gate lines and the data lines.

The first transistor 31a and the second transistor 32a are arranged inside the circuit element layer 3a separately for each of the subpixel areas 21 and 22. The first transistor 31a according to one example may be connected to the first sub electrode 51 arranged on the first subpixel area 21 and then may apply a driving voltage to emit light of a color corresponding to the first subpixel area 21.

The second transistor 32a according to one example may be connected to the second sub electrode 52 arranged on the second subpixel area 22 and then may apply a driving voltage to emit light of a color corresponding to the second subpixel area 22.

Each of the first subpixel area 21 and the second subpixel area 22 according to one example provides an organic light emitting diode with a predetermined current in accordance with a data voltage of a data line when a gate signal from a gate line is input thereto using each of the transistors 31a and 32a. For this reason, the organic light emitting diode of each of the first subpixel area 21 and the second subpixel area 22 may emit light with predetermined brightness in accordance with a predetermined current.

The insulating layer 3 may be provided on the substrate 2. In more detail, the insulating layer 3 may be arranged on the circuit element layer 3a arranged on the substrate 2.

The insulating layer 3 may include a first recessed portion 31 provided on the first subpixel area 21 and a second recessed portion 32 provided on the second subpixel area 22. The insulation layer 3 may further include a convex portion 33 provided between the first recessed portion 31 and the second recessed portion 32.

The first recessed portion 31 may formed by patterning the insulating layer 3 arranged on the first subpixel area 21 using a lift-off or dry etching process. Therefore, the first recessed portion 31 may be formed on the first subpixel area 21 in a recessed shape toward the substrate 2 from the organic light emitting layer 7.

Likewise, the second recessed portion 32 may be formed by patterning the insulating layer 3 arranged on the second subpixel area 22 in the same manner as the first recessed portion 31. Therefore, the second recessed portion 32 may be formed on the second subpixel area 22 in a recessed shape toward the substrate 2 from the organic light emitting layer 7. The first recessed portion 31 and the second recessed portion 32 may be formed at the same time.

The first recessed portion 31 and the second recessed portion 32 may be formed on the insulating layer 3 through various patterning methods without limitation to the patterning method such as lift-off or dry etching. The insulating layer 3 including the first recessed portion 31, the second recessed portion 32 and the convex portion 33 may be formed through a deposition method.

The convex portion 33 may be formed to be protruded toward the encapsulation layer 10 arranged on the upper side between the first recessed portion 31 and the second recessed portion 32. The convex portion 33 may be formed at both sides of the first recessed portion 31 and the second recessed portion 32 as the first recessed portion 31 and the second recessed portion 32 are patterned. The convex portion 33 may be formed between the first recessed portion 31 and the second recessed portion 32 through a deposition method. The convex portion 33 may include a convex top surface 331 arranged on a place relatively higher than the first recessed portion 31 or the second recessed portion 32.

The first recessed portion 31 may include a first recessed bottom surface 311 arranged at a relatively low position, that is, to be close to the substrate 2 and a first recessed side surface 312 connecting the first recessed bottom surface 311 with the convex top surface 331 of the convex portion 33.

Likewise, the second recessed portion 32 may include a second recessed bottom surface 321 arranged to be close to the substrate 2 and a second recessed side surface 322 connecting the second recessed bottom surface 321 with the convex top surface 331 of the convex portion 33.

The first recessed portion 31 and the second recessed portion 32 may be formed by patterning the insulating layer 3 arranged at both sides of the convex portion 33 with a dented shape or recessed shape so that the reflective electrode 4 may reflect light toward a corresponding subpixel area. The insulating layer 3 including the first recessed portion 31, the second recessed portion 32 and the convex portion 33 is provided separately from the circuit element layer 3a as described above, but is not limited to this. The insulating layer 3 may be omitted, and the first recessed portion 31, the second recessed portion 32, and the convex portion 33 may be formed by patterning the circuit element layer 3a. In this case, the display device 1 according to one embodiment of the present disclosure may be embodied not only to be compact in accordance with a reduced overall thickness but also to enhance convenience of wearability and mobility due to a reduced weight according to the reduced thickness.

The reflective electrode 4 may be arranged on the insulating layer 3. The reflective electrode 4 is to reflect light emitted from the organic light emitting layer 7 of each of the first subpixel area 21 and the second subpixel area 22. The reflective electrode 4 may include a reflective material to reflect light. For example, the reflective material may be, but not limited to, a metal, and may be other materials as long as they reflect light.

Since the reflective electrode 4 is arranged on a place relatively lower than the organic light emitting layer 7 emitting light, the reflective electrode 4 may reflect light emitted from the organic light emitting layer 7 toward the upper side. In this case, the upper side means a direction where a user can recognize light, for example, it may mean the direction where the encapsulation layer 10 or a color filter layer (not shown) is arranged. Therefore, for each of the subpixel areas 21 and 22, light efficiency may be more enhanced than the case where the reflective electrode 4 is not provided, and a user may recognize an image of high luminance, that is, a clear image through the enhanced light efficiency.

The reflective electrode 4 may include a first reflective electrode 41 provided in the first recessed portion 31 and a second reflective electrode 42 provided in the second recessed portion 32. And the first reflective electrode 41 may have a first recessed portion and a convex portion, and the second reflective electrode 42 may have a second recessed portion and a convex portion.

The first reflective electrode 41 may be arranged on the first subpixel area 21 to reflect light emitted from the organic light emitting layer 7. In more detail, the first reflective electrode 41 may be formed to be extended from the first recessed bottom surface 311 to the first recessed side surface 312 and the convex top surface 331 to reflect light emitted from the organic light emitting layer 7 arranged on the first subpixel area 21. In this case, the first reflective electrode 41 arranged on the convex top surface 331 may be formed to cover only a portion of the convex top surface 331.

The second reflective electrode 42 may be arranged on the second subpixel area 22 to reflect light emitted from the organic light emitting layer 7. In more detail, the second reflective electrode 42 may be formed to be extended from the second recessed bottom surface 321 to the second recessed side surface 322 and the convex top surface 331 to reflect light emitted from the organic light emitting layer 7 arranged on the second subpixel area 22. In this case, the second reflective electrode 42 arranged on the convex top surface 331 may be formed to cover only a portion of the convex top surface 331.

The first reflective electrode 41 and the second reflective electrode 42 arranged to cover a portion of the convex top surface 331 may be spaced apart from each other at a predetermined distance to prevent short from being generated.

The first electrode 5 is provided on the second substrate 2. The first electrode 5 according to one example may be formed to include a metal material of high reflectivity such as a deposited structure (Ti/Al/Ti) of aluminum and titanium, a deposited structure (ITO/Al/ITO) of aluminum and ITO, an APC alloy, and a deposited structure (ITO/APC/ITO) of APC alloy and ITO. The APC alloy is an alloy of silver (Ag), palladium (Pb), and Copper (Cu). The first electrode 5 may be an anode. The first electrode 5 may include the first sub electrode 51 and the second sub electrode 52.

The first sub electrode 51 may be provided on the first subpixel area 21. The first sub electrode 51 may be formed on the first reflective electrode 41. The first sub electrode 51 is connected to a source electrode of the first transistor 31a through a contact hole that passes through the circuit element layer 3a, the insulating layer 3 and the first reflective electrode 41.

The second sub electrode 52 may be provided on the second subpixel area 22. The second sub electrode 52 may be formed on the second reflective electrode 42. The second sub electrode 52 is connected to a source electrode of the second transistor 32a through a contact hole that passes through the circuit element layer 3a, the insulating layer 3, and the second reflective electrode 42.

Referring to FIGS. 1 and 2, the bank 6 is provided between the first subpixel area 21 and the second subpixel area 22 while covering an end of the first electrode 5. The bank 6 may be included in a bank area (area with slashes in FIG. 1) surrounding the first sub electrode 51 and the second sub electrode 52. The bank 6 according to one example is to partition the first subpixel area 21 from the second subpixel area 22. The bank 6 serves to define a subpixel area, that is, a light emitting portion. Also, since an area where the bank 6 is formed does not emit light, the area may be defined as a non-light emitting portion. The bank 6 may be formed of an organic film such as acryl resin, epoxy resin, phenolic resin, polyamide resin, and polyimide resin. The organic light emitting layer 7 is formed on the first electrode 5 and the bank 6.

Referring to FIG. 2, the bank 6 may include a bank top surface 61 and a bank inclined surface 62.

The bank top surface 61 of the bank 6 is a surface arranged on the upper side in the bank 6.

The bank inclined surface 62 of the bank 6 is a surface extended from the bank top surface 61 to a top surface of each of the first sub electrode 51 and the second sub electrode 52. Therefore, the bank inclined surface 62 and the top surface of the first sub electrode 51, and the bank inclined surface 62 and the top surface of the second sub electrode 52 may have a predetermined angle, respectively. The predetermined angle may be 50° or more and less than 90° as a width of the bank becomes narrow due to high resolution of the display device. The width of the bank may become narrow as a distance between subpixel areas becomes narrow. Therefore, in the display device 1 according to one embodiment of the present disclosure, light emitted from the first subpixel area 21 may not be totally reflected to the bank 6 and may enter the inside of the bank 6. Therefore, as the display device 1 according to one embodiment of the present disclosure comprises the first reflective electrode 41 to emit light entering the bank 6 to the outside of the bank 6, the first reflective electrode 41 may reflect light emitted from the first subpixel area 21, moving to the bank 6 to emit the light to the first subpixel area 21.

The organic light emitting layer 7 is provided on the first electrode 5. The organic light emitting layer 7 according to one example is a common layer commonly formed on the first subpixel area 21 and the second subpixel area 22, and may be a white light emitting layer emitting white light. In this case, the organic light emitting layer 7 may be formed with a tandem structure including more than 2 stacks. Each of the stacks may include a hole transporting layer (HTL), at least one light emitting layer, and an electron transporting layer (ETL). When a high potential voltage is applied to the first electrode 5 and a low potential voltage is applied to the second electrode 8, holes and electrons are transferred to the organic light emitting layer 7 through the hole transporting layer and the electron transporting layer, respectively and are combined with each other in the organic light emitting layer 7 to emit light.

For example, the organic light emitting layer 7 is comprised of a plurality of organic layers, wherein the plurality of organic layers include a first stack, a second stack, and a charge generating layer provided between the first stack and the second stack. The first stack may include a first hole transporting layer, a first light emitting layer emitting light of a first color, and a first electron transporting layer. The second stack may include a second hole transporting layer, a second light emitting layer emitting light of a second color, and a second electron transporting layer.

Also, the charge generating layer may be formed between the stacks. The charge generating layer may include an n-type charge generating layer arranged to be adjacent to the first stack and a p-type charge generating layer formed on the n-type charge generating layer and arranged to be adjacent to the second stack. The n-type charge generating layer injects electrons into the first stack, and the p-type charge generating layer injects holes into the second stack. The n-type charge generating layer may be comprised of an organic layer doped with alkali metal such as Li, Na, K, or Cs or alkali earth metal such as Mg, Sr, Ba, or Ra. The p-type charge generating layer may be made by doping a dopant on an organic material that is capable of transporting holes.

The second electrode 8 is provided on the organic light emitting layer 7. The second electrode 8 according to one example is a common layer commonly formed on the first subpixel area 21 and the second subpixel area 22. The second electrode 8 may be formed of a transparent conductive materials (TCO) such as ITO and IZO that are capable of transmitting light or a semi-transmissive conductive material such as Mg, Ag, or an alloy of Mg and Ag.

The second electrode 8 may include a first portion 81 provided on a relatively low place while being overlapped with the first electrode 5, a second portion 82 provided on a relatively high place while being overlapped with the bank 6, and a third portion 83 connecting the first portion 81 with the second portion 82.

In more detail, the first portion 81 may be arranged in parallel with the first recessed bottom surface 311 while being overlapped with the first recessed bottom surface 311 at the lowest position of the second electrode 8. Alternatively, the first portion 81 may be arranged in parallel with the first sub electrode 51 while being overlapped with the first sub electrode 51 at the lowest position of the second electrode 8. However, without limitation to this case, the first portion 81 may be overlapped with the first recessed bottom surface 311 or the first sub electrode 51 partially or entirely and therefore may have an inclination similar to that of the first recessed bottom surface 311 or the first sub electrode 51.

The second portion 82 may be arranged in parallel with the bank top surface 61 of the bank 6 while being overlapped with the bank top surface 61 at a relatively high position, that is, the bank top surface 61. Alternatively, the second portion 82 may be arranged in parallel with the convex top surface 331 while being partially overlapped with the convex top surface 331 of the convex portion 33. However, without limitation to this case, the second portion 82 may be overlapped with the bank top surface 61 and the convex top surface 331 partially or entirely and therefore may have an inclination similar to that of the bank top surface 61 or the convex top surface 331.

The third portion 83 may be arranged in parallel with the bank inclined surface 62 of the bank 6 while being overlapped with the bank inclined surface 62. Alternatively, the third portion 83 may be arranged in parallel with the first recessed side surface 312 while being partially overlapped with the first recessed side surface 312. However, without limitation to this case, the third portion 83 may be overlapped with the bank inclined surface 62 or the first recessed side surface 312 partially or entirely and therefore may have an inclination similar to that of the bank inclined surface 62 or the first recessed side surface 312.

A light path change structure 9 and an encapsulation layer 10 may be formed on the second electrode 8. The encapsulation layer 10 serves to prevent oxygen or water from being permeated into the organic light emitting layer 7. To this end, the encapsulation layer 10 may include at least one inorganic film and at least one organic film.

For example, the encapsulation layer 10 may include a first inorganic film, an organic film, and a second inorganic film. In this case, the first inorganic film is formed to cover the second electrode 8. The organic film is formed to cover the first inorganic film. It is preferable that the organic film is formed at a sufficient thickness to prevent particles from being permeated into the organic light emitting layer 7 and the second electrode 8 by passing through the first inorganic film. The second inorganic film is formed to cover the organic film.

The encapsulation layer 10 may prevent oxygen or water from being permeated into the light path change structure 9 or the second electrode 8.

In FIG. 2, only up to the encapsulation layer 10 arranged on the second electrode 8 is shown for convenience of description. In the case that an organic light emitting diode includes only white organic light emitting diode, red, green and blue color filters may be arranged on the encapsulation layer 10 to embody red, green and blue colors. In this case, a black matrix (BM) may be arranged between the color filters to partition the color filters. In the case that the organic light emitting diode includes red, green, and blue organic light emitting diodes to emit light of red, green and blue colors, the red, green and blue color filters may not be arranged on the encapsulation layer 10.

Referring to FIG. 2 again, since the first reflective electrode 41 is inclined at a predetermined angle with respect to the substrate 2, the first reflective electrode 41 cannot emit light entering through the bank 6 to the first subpixel area 21. Therefore, light entering through the bank 6 may partially be reflected by the first reflective electrode 41 and emitted to an adjacent subpixel area through the bank top surface 61. In this case, since some problems such as image distortion in the subpixel area 21 and light spread may occur, the display device 1 according to one embodiment of the present disclosure may include the light path change structure 9 that may change a path of light. An inclination angle of the first reflective electrode 41 to the substrate 2 may be provided within a range between 50° and 60°.

The light path change structure 9 may be arranged on the second electrode 8 while being overlapped with the bank 6. In more detail, the light path change structure 9 may be formed to be in contact with the second portion 82 of the second electrode 8 while being overlapped with the bank top surface 61 partially or entirely.

The light path change structure 9 may change a path of light by refracting or reflecting light emitted from the organic light emitting layer 7. In the display device 1 according to the present disclosure, embodiments may be distinguished in accordance with a shape, a refractive index, and structure materials of the light path change structure 9.

Referring to FIG. 2, in the display device 1 according to one embodiment of the present disclosure, the light path change structure 9 formed with a trapezoidal shape may change a light path by refracting light emitted from the organic light emitting layer 7 or light reflected by the first reflective electrode 41.

As shown in FIG. 2, light emitted from the organic light emitting layer 7 of the first subpixel area 21 may partially enter the inside of the bank 6 and then be reflected by the first reflective electrode 41, thereby entering the light path change structure 9 through the second portion 82 of the second electrode and the bank top surface 61. Likewise, although not shown, light emitted from the organic light emitting layer 7 of the second subpixel area 22 may be reflected by the second reflective electrode 42 and then enter the light path change structure 9 through the bank top surface 61 and the second portion 82. Since light emitted from each of the subpixel areas 21 and 22 may be emitted to the outside through the same path, description will be given based on the first subpixel area 21 in the present disclosure.

The light path change structure 9 may include a top surface 91, a bottom surface 92, and an inclined surface 93. The top surface 91 is a surface arranged at the uppermost portion of the light path change structure 9. The bottom surface 92 is a surface arranged at the lowest portion of the light path change structure 9 and may be in contact with the second portion 82 of the second electrode 8. The inclined surface 93 may connect the top surface 91 with the bottom surface 92. The bottom surface 92 and the inclined surface 93 may have a predetermined angle, and the top surface 91 and the inclined surface 93 may also have a predetermined angle. As the angle is changed, the light path may be changed.

An end of the bottom surface 92 of the light path change structure 9 may be matched or aligned with an end of the second portion 82 of the second electrode 8. Therefore, as shown in FIG. 2, the bottom surface 92 of the light path change structure 9 and the second portion 82 of the second electrode 8 may have the same length L1 in a longitudinal direction (i.e., a direction in parallel to a long side of the substrate). Therefore, light reflected by the first reflective electrode 41, moving to the second subpixel area 22 may enter the inside of the light path change structure 9 through the bottom surface 92 of the light path change structure 9. Light entering the inside of the light path change structure 9 may be emitted to the first subpixel area 21 due to a change of the light path.

In FIG. 2, a single light path change structure 9 is in contact with the second portion 82 of the second electrode 8 as an example, but is not limited to this case. That is, a plurality of light path change structures 9 may be provided on the second portion 82 and may change a path of light entering through the bottom surface 92. In this case, a length of the bottom surface of each of the plurality of light path change structures 9 is shorter than the length of the second portion 82 and at least one of ends of the bottom surface 92 of each of the plurality of light path change structures 9 may be matched with the end of the second portion 82. Therefore, the light reflected by the first reflective electrode 41 may enter the bottom surface 92 of each of the plurality of light path change structures 9.

The light path change structure 9 may be formed to have a refractive index smaller than a refractive index of the bank 6, thereby changing a path of incident light from the bank 6. For example, if a refractive index of the bank 6 is 1.8, the light path change structure 9 may have a refractive index of 1.05. In this case, each of the second electrode 8 and the organic light emitting layer 7 arranged between the bank 6 and the light path change structure 9 may have a refractive index the same as or similar to the refractive index of the bank 6. Therefore, light entering the bank 6 is reflected by the first reflective electrode 41 to pass through the bank top surface 61, the organic light emitting layer 7 and the second portion 82 of the second electrode 8 in a straight line without refraction, and its path may be changed in accordance with a difference in refractive indexes while the light is entering the light path change structure 9. The greater the difference in refractive indexes is, the greater a refractive angle of light, that is, a change of the light path may be.

Referring to FIG. 2 again, the light passing through the second portion 82 of the second electrode 8 may enter the bottom surface 92 of the light path change structure 9. Since the refractive index of the light path change structure 9 is smaller than a refractive index of the second portion 82 of the second electrode 8, the light entering the bottom surface 92 of the light path change structure 9 may be refracted to the right as shown in FIG. 2. The light refracted to the right may be emitted to the encapsulation layer 10 through the inclined surface 93 of the light path change structure 9. In this case, since the refractive index of the encapsulation layer 10 is 1.8 which is greater than the refractive index of the light path change structure 9, a path of the light may be refracted to the left as shown in FIG. 2. As a result, the light path change structure 9 may change the light path to the first subpixel area 21 because its refractive index is smaller than that of the second portion 82 of the second electrode 8 arranged on the area where light enters and that of the encapsulation layer 10 arranged on the area where light is emitted.

In the display device 1 according to one embodiment of the present disclosure, the bottom surface 92 and the inclined surface 93 of the light path change structure 9 may have a first angle θ1. As the first angle θ1 is changed, a path of the light entering the bottom surface 92 of the light path change structure 9, emitted to the inclined surface 93 may be changed. Therefore, in the display device 1 according to one embodiment of the present disclosure, the first angle θ1 and the refractive index of the light path change structure 9 are the important factors that may change a path of light.

The first angle θ1 may range from 45° to 55° and the refractive index of the light path change structure 9 may range from 1.05 to 1.35. If the first angle θ1 is less than 45° and the refractive index of the light path change structure 9 is less than 1.05, light emitted through the inclined surface 93 is refracted to the second subpixel area 22, whereby image distortion or light spread may occur. If the first angle θ1 exceeds 55° and the refractive index of the light path change structure 9 exceeds 1.35, light emitted through the inclined surface 93 is refracted to a third subpixel area (not shown) adjacent to a right side of the first subpixel area 21, whereby image distortion or light spread may occur. Therefore, the display device 1 according to one embodiment of the present disclosure may change the light path to the first subpixel area 21 through the first angle θ1 and the refractive index of the light path change structure 9.

For example, if the first angle θ1 is 45° or more and less than 48° and the refractive index of the light path change structure 9 is 1.05 or more and 1.15 or less, incident light through the bottom surface 92 of the light path change structure 9 may be emitted by changing its path to the first subpixel area 21 through the inclined surface 93. In more detail, incident light through the bottom surface 92 of the light path change structure 9 may be emitted to the first subpixel area 21 by primarily changing its path in accordance with a difference in refractive indexes between the second portion 82 of the second electrode 8 and the light path change structure 9 and secondarily changing its path in accordance with a difference in refractive indexes between the light path change structure 9 and the encapsulation layer 10 on the inclined surface 93. In this case, if the first angle θ1 is less than 45° or 48° or more, image distortion or light spread may occur.

Likewise, if the first angle θ1 is 48° or more and less than 52° and the refractive index of the light path change structure 9 is 1.15 or more and 1.25 or less, incident light through the bottom surface 92 of the light path change structure 9 may be emitted to the first subpixel area 21 through the primary and secondary path changes.

Also, if the first angle θ1 is 52° or more and 55° or less and the refractive index of the light path change structure 9 is 1.25 or more and 1.35 or less, incident light through the bottom surface 92 of the light path change structure 9 may be emitted to the first subpixel area 21 through the primary and secondary path changes.

As a result, since the display device 1 according to one embodiment of the present disclosure may emit the incident light through the bottom surface 92 of the light path change structure 9 to the first subpixel area 21 through the primary and secondary path changes based on the first angle θ1 ranging from 45° to 55° and the refractive index of the light path change structure 9 ranging from 1.05 to 1.35, image distortion and light spread may be prevented from occurring in the first subpixel area 21.

Figure 3A:
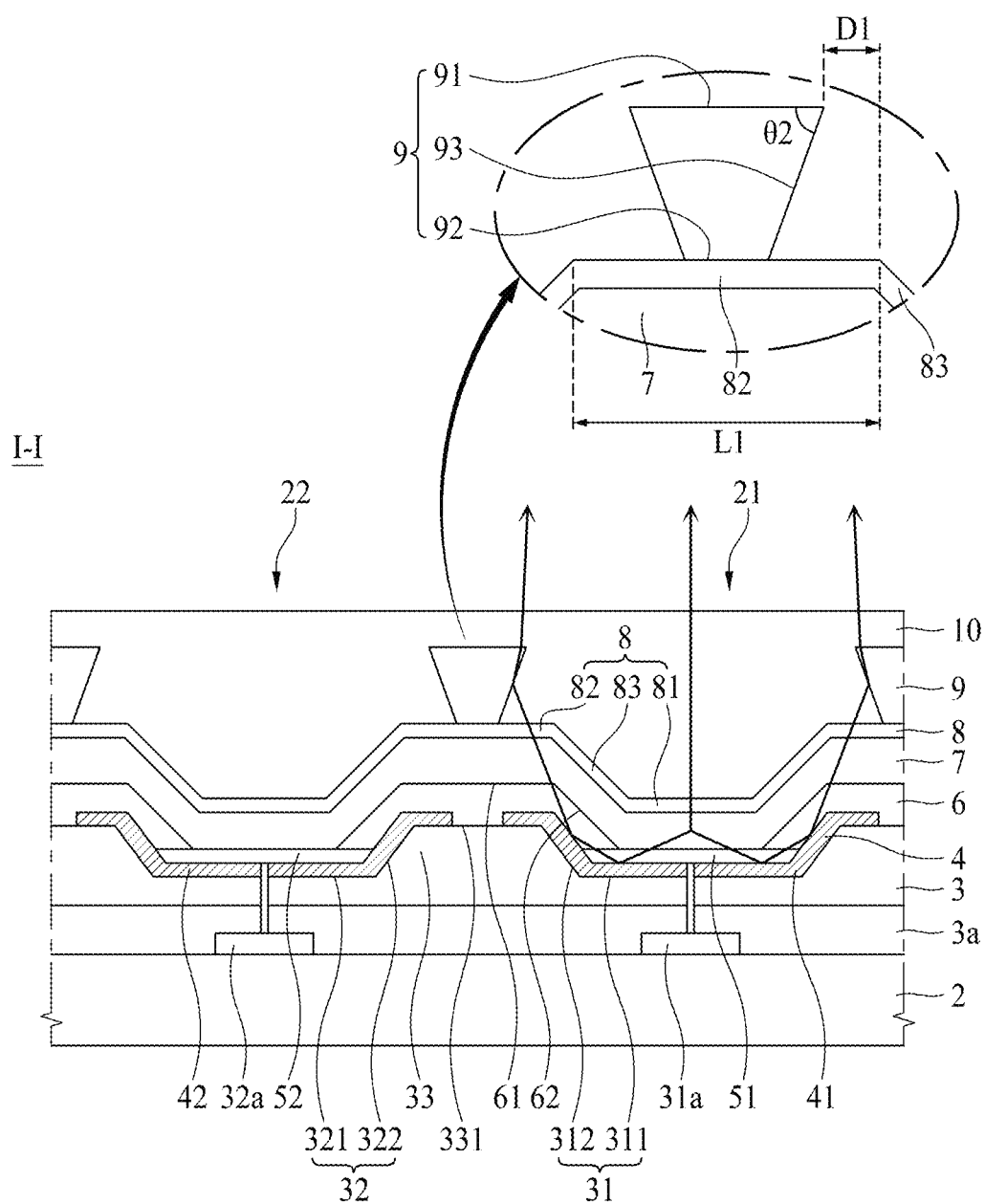
FIG. 3A is a brief cross-sectional view illustrating a display device according to the second embodiment of the present disclosure.
Figure 3B:
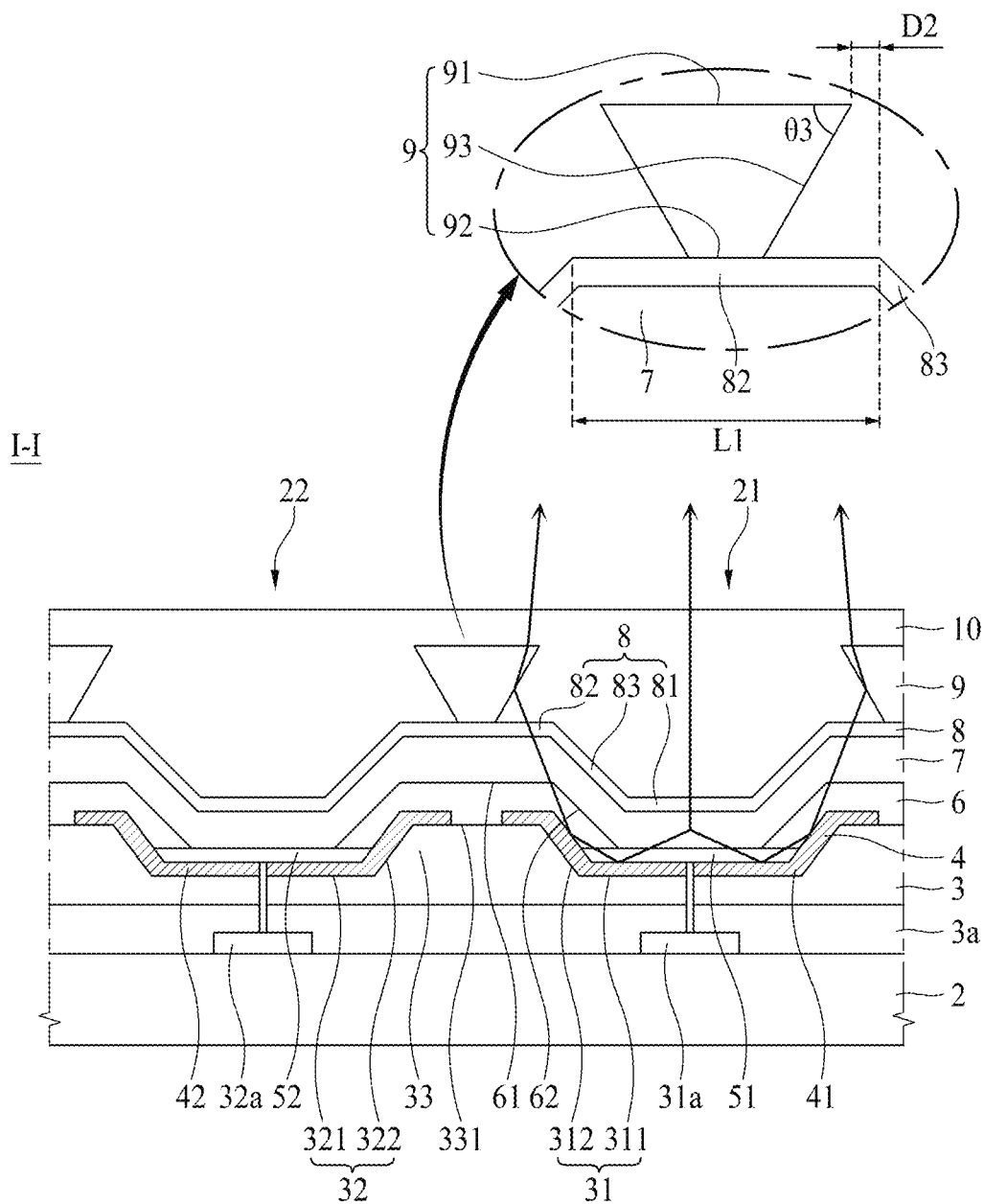
FIG. 3B is a brief cross-sectional view illustrating a display device according to a modified embodiment of the second embodiment of the present disclosure.
Figure 4A:
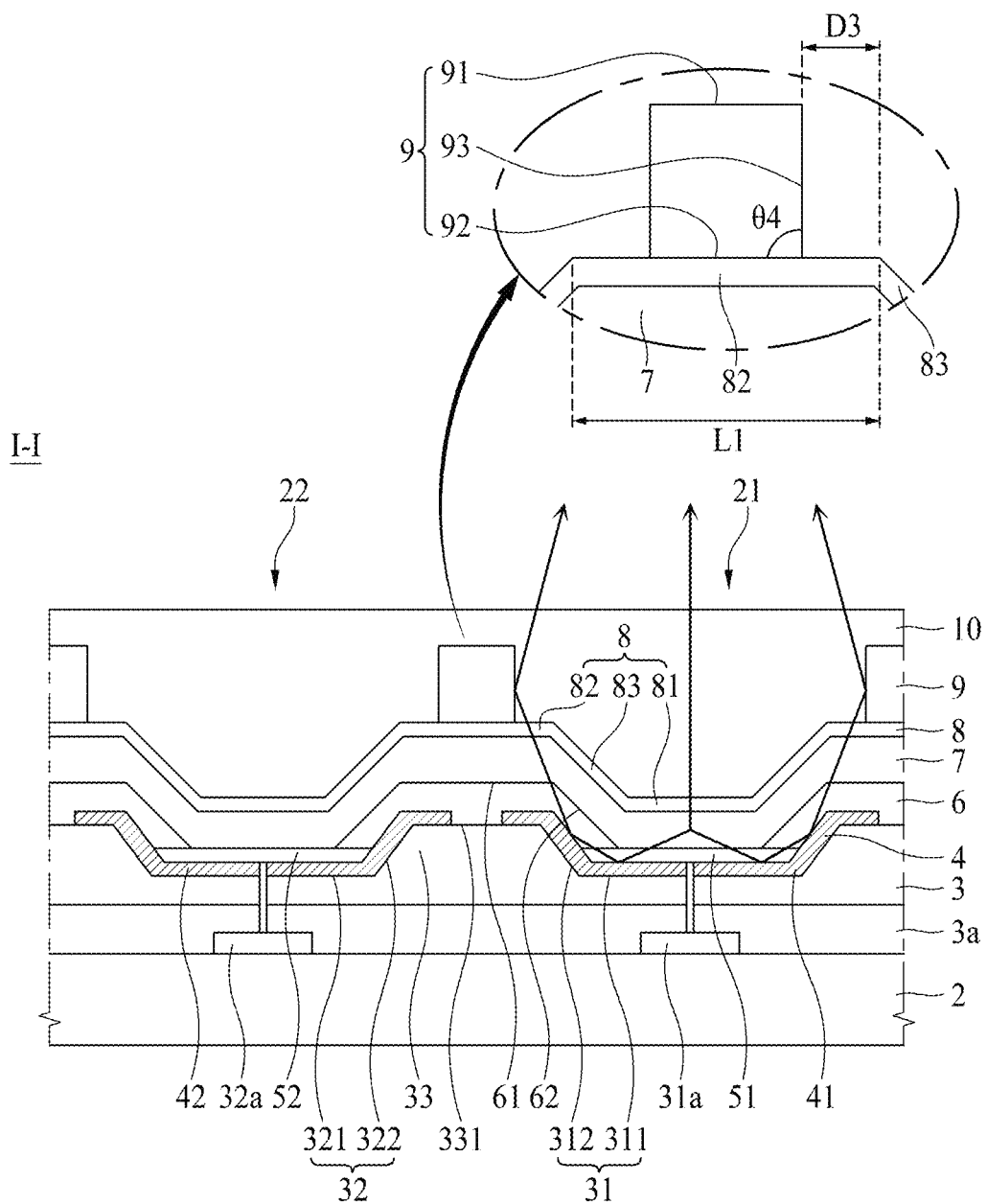
FIG. 4A is a brief cross-sectional view illustrating a display device according to the third embodiment of the present disclosure.
Figure 4B:
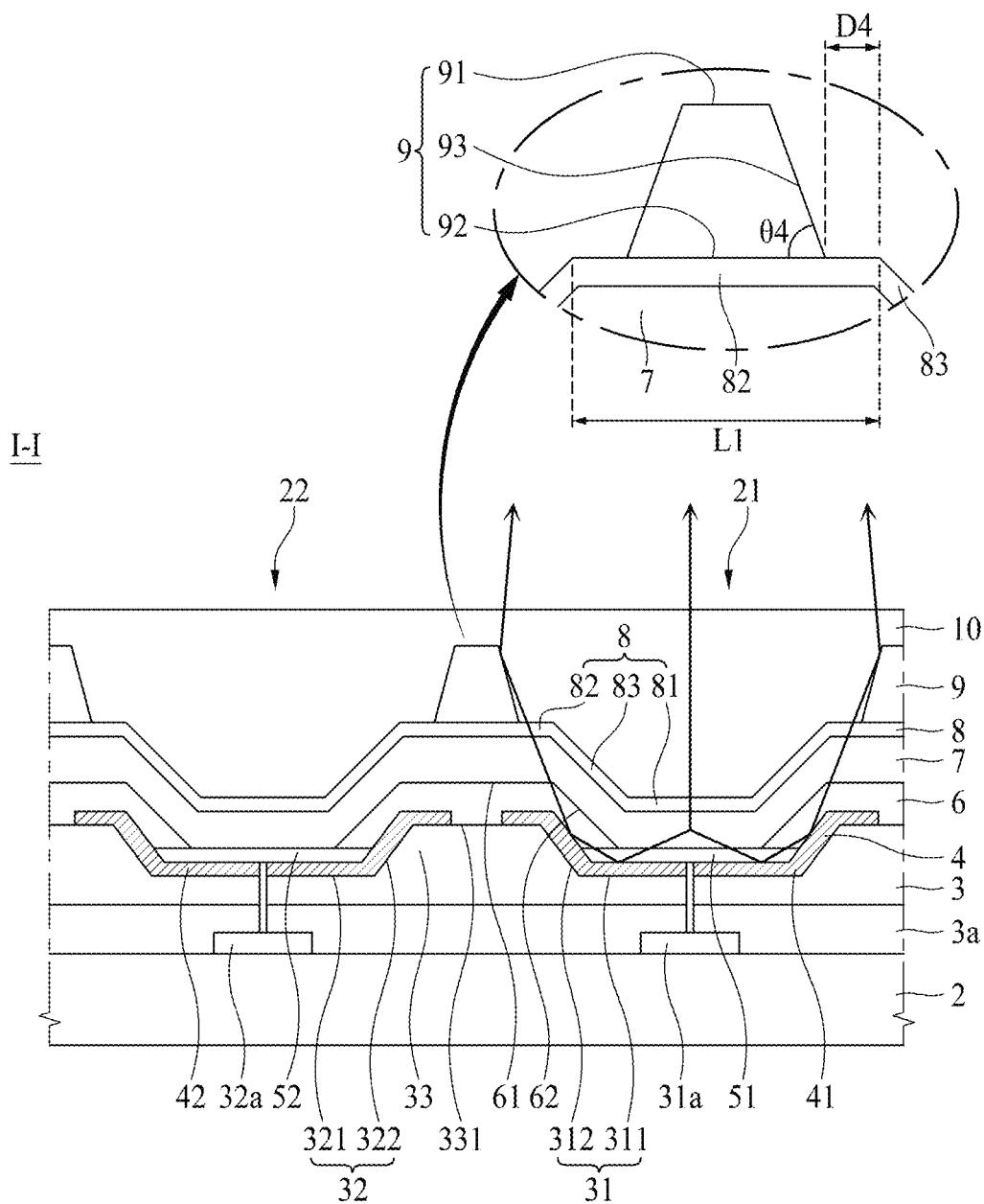
FIG. 4B is a brief cross-sectional view illustrating a display device according to a modified embodiment of the third embodiment of the present disclosure.

FIG. 3A is a brief cross-sectional view illustrating a display device according to the second embodiment of the present disclosure, FIG. 3B is a brief cross-sectional view illustrating a display device according to a modified embodiment of the second embodiment of the present disclosure, FIG. 4A is a brief cross-sectional view illustrating a display device according to the third embodiment of the present disclosure, and FIG. 4B is a brief cross-sectional view illustrating a display device according to a modified embodiment of the third embodiment of the present disclosure.

Referring to FIG. 3A, in the display device 1 according to the second embodiment of the present disclosure, the light path change structure 9 formed with a reversed trapezoidal shape may change a light path by refracting light emitted from the organic light emitting layer 7 or light reflected by the first reflective electrode 41.

The light path change structure 9 of the display device 1 according to the second embodiment of the present disclosure may be formed to have the bottom surface 92 shorter than the top surface 91 in length. Therefore, the light path change structure 9 may be formed with a reversed trapezoidal shape and the length of the bottom surface 92 may be shorter than the length L1 of the second portion 82 of the second electrode 8. In this case, the top surface 91 of the light path change structure 9 may also be formed to be shorter than the length L1 of the second portion 82. Therefore, the top surface 91 of the light path change structure 9 may be spaced apart from the end of the second portion 82 of the second electrode 8 at a first spaced distance D1, wherein the first spaced distance D1 may range from 0.5 μm to 1 μm.

If the top surface 91 of the light path change structure 9 is spaced apart from the end of the second portion 82 at less than 0.5 μm, light entering the light path change structure 9 is emitted to the second subpixel area 22, whereby image distortion or light spread may occur. If the top surface 91 of the light path change structure 9 is spaced apart from the end of the second portion 82 by exceeding 1 μm, since light reflected to the first reflective electrode 41 cannot enter the light path change structure 9, the light moves to the second subpixel area 22, whereby image distortion or light spread may occur. Therefore, in the display device 1 according to the second embodiment of the present disclosure, as the top surface 91 of the light path change structure 9 may be spaced apart from the end of the second portion 82 within the range between 0.5 μm to 1 μm, a path of light entering the light path change structure 9 may be changed to emit the light to the first subpixel area 21, whereby image distortion or light spread may be prevented from occurring.

As shown in FIG. 3A, light emitted from the organic light emitting layer 7 of the first subpixel area 21 may partially enter the inside of the bank 6 and then be reflected by the first reflective electrode 41 and enter the light path change structure 9 through the bank top surface 61 and the second portion 82 of the second electrode 8. In this case, unlike the display device 1 according to one embodiment of the present disclosure, since the bottom surface 92 of the light path change structure 9 is shorter than the length L1 of the second portion 82, light emitted from the second portion 82 may enter the light path change structure 9 through the inclination surface 93 of the light path change structure 9 after passing through the encapsulation layer 10. The light entering the light path change structure 9 through the inclined surface 93 may be emitted through the top surface 91 of the light path change structure 9 as shown in FIG. 3A. Therefore, in the display device 1 according to the second embodiment of the present disclosure, the second angle θ2 between the inclined surface 93 and the top surface 91 may be an important factor that may change the light path.

The light path change structure 9 may be formed to have a refractive index smaller than a refractive index of the encapsulation layer 10 to change a path of incident light from the encapsulation layer 10. For example, if the refractive index of the encapsulation layer 10 is 1.8, the refractive index of the light path change structure 9 may be 1.05. The light path may be changed depending on a difference in the refractive indexes between the light path change structure 9 and the encapsulation layer 10. The greater the difference in refractive indexes is, the greater a refractive angle of light, that is, a change of the light path may be.

Referring to FIG. 3A again, the light passing through the second portion 82 of the second electrode 8 may enter the inclined surface 93 of the light path change structure 9 through the encapsulation layer 10. Since the refractive index of the light path change structure 9 is smaller than a refractive index of the encapsulation layer 10, the light entering the inclined surface 93 of the light path change structure 9 may be refracted to the right as shown in FIG. 3A. The light refracted to the right may be emitted to the encapsulation layer 10 through the top surface 91 of the light path change structure 9. In this case, since the refractive index of the encapsulation layer 10 is 1.8 which is greater than the refractive index of the light path change structure 9, a path of the light may be refracted to the left as shown in FIG. 3A. As a result, the light path change structure 9 may change the light path to the first subpixel area 21 because its refractive index is smaller than that of the encapsulation layer 10 arranged on the area where light enters and is emitted.

In the display device 1 according to second embodiment of the present disclosure, the top surface 91 and the inclined surface 93 of the light path change structure 9 may have a second angle θ2. As the second angle θ2 is changed, a path of the light entering the inclined surface 93 of the light path change structure 9, emitted to the top surface 91 may be changed.

The second angle θ2 may range from 55° to 70°, and therefore the refractive index of the light path change structure 9 may range from 1.05 to 1.34. If the second angle θ2 is less than 55° and the refractive index of the light path change structure 9 is less than 1.05, light is totally reflected without entering the inclined surface 93, whereby the light may be reflected to a third subpixel area (not shown) adjacent to the right side of the first subpixel area 21. For this reason, image distortion or light spread may occur. Alternatively, if the second angle θ2 is less than 55° and the refractive index of the light path change structure 9 is less than 1.05, light entering through the inclined surface 93, emitted through the top surface 91 is refracted to be biased toward the third subpixel area, whereby image distortion or light spread may occur. If the second angle θ2 exceeds 70° and the refractive index of the light path change structure 9 exceeds 1.34, light emitted through the top surface 91 is refracted to the second subpixel area 22, whereby image distortion or light spread may occur. Therefore, in the display device 1 according to the second embodiment of the present disclosure, the light path may be changed to the first subpixel area 21 through the second angle θ2 and the refractive index of the light path change structure 9.

For example, if the second angle θ2 is 55° or more and less than 59° and the refractive index of the light path change structure 9 is 1.05 or more and 1.25 or less, incident light through the inclined surface 93 of the light path change structure 9 may be emitted to the first subpixel area 21 through the top surface 91 by changing its path. In more detail, the incident light through the inclined surface 93 of the light path change structure 9 may be emitted to the first subpixel area 21 by primarily changing its path in accordance with a difference in refractive indexes between the encapsulation layer 10 and the light path change structure 9 and secondarily changing its path in accordance with a difference in refractive indexes between the light path change structure 9 and the encapsulation layer 10 on the top surface 91. In this case, if the second angle θ2 is less than 55° or 59° or more, image distortion or light spread may occur.

Likewise, if the second angle θ2 is 59° or more and less than 65° and a refractive index of the light path change structure 9 is 1.25 or more and 1.3 or less, incident light through the inclined surface 93 of the light path change structure 9 may be emitted to the first subpixel area 21 through the primary and secondary path changes.

Also, if the second angle θ2 is 65° or more and 70° or less and a refractive index of the light path change structure 9 is 1.3 or more and 1.34 or less, incident light through the inclined surface 93 of the light path change structure 9 may be emitted to the first subpixel area 21 through the primary and secondary path changes.

As a result, in the display device 1 according to one embodiment of the present disclosure, the top surface 91 of the light path change structure 9 is spaced apart from the end of the second portion 82 of the second electrode 8 at a first spaced distance D1, and the incident light through the inclined surface 93 of the light path change structure 9 may be emitted to the first subpixel area 21 through the primary and secondary path changes based on the second angle θ2 ranging from 55° to 70° and the refractive index of the light path change structure 9 ranging from 1.05 to 1.34, whereby image distortion or light spread may be prevented from occurring in the first subpixel area 21.

Referring to FIG. 3B, in the display device 1 according to a variant of the second embodiment of the present disclosure, the light path change structure 9 formed with a reversed trapezoidal shape may change a light path by refracting light emitted from the organic light emitting layer 7 or incident light reflected by the first reflective electrode 41.

The display device 1 according to a modified embodiment of the second embodiment of the present disclosure is the same as the display device 1 according to the second embodiment of the present disclosure described above except that a second spaced distance D2 for the top surface 91 of the light path change structure 9 spaced apart from the end of the second portion 82 of the second electrode 8 and a third angle θ3 between the top surface 91 and the inclined surface 93 are different from the first spaced distance D1 and the second angle θ2 of the display device 1 according to the second embodiment of the present disclosure. Therefore, the same reference numbers are given to the same elements, and only different elements will be described hereinafter.

The top surface 91 of the light path change structure 9 of the display device 1 according to the modified embodiment of the second embodiment of the present disclosure may be spaced apart from the end of the second portion 82 of the second electrode 8 at a second spaced distance D2, wherein the second spaced distance D2 may range from 0 μm to 0.5 μm.

If the top surface 91 of the light path change structure 9 is spaced apart from the end of the second portion 82 by exceeding 0.5 μm, since light may not enter the inclined surface 93 of the light path change structure 9 or light entering the light path change structure 9 is emitted to the second subpixel area 22, image distortion or light spread may occur. Therefore, in the display device 1 according to the modified embodiment of the second embodiment of the present disclosure, as the top surface 91 of the light path change structure 9 may be spaced apart from the end of the second portion 82 within the range between 0 μm to 0.5 μm, the light entering the light path change structure 9 may be emitted to the first subpixel area 21 by changing its path, whereby image distortion or light spread may be prevented from occurring in the first subpixel area 21.

As shown in FIG. 3B, light emitted from the organic light emitting layer 7 of the first subpixel area 21 may partially enter the inside of the bank 6 and then be reflected by the first reflective electrode 41 and enter the light path change structure 9 through the bank top surface 61, the second portion 82 of the second electrode 8 and the encapsulation layer 10. In this case, the reason why light enters the inclined surface 93 of the light path change structure 9 through the encapsulation layer 10 is the same as described in the display device 1 according to the second embodiment of the present disclosure.

In the display device 1 according to the modified embodiment of the second embodiment of the present disclosure, the top surface 91 and the inclined surface 93 of the light path change structure 9 may have a third angle θ3. As the third angle θ3 is changed, a path of light entering the inclined surface 93 of the light path change structure 9, emitted to the top surface 91 may be changed.

The third angle θ3 may range from 45° to 70° and the refractive index of the light path change structure 9 in this case may range from 1 to 1.34. If the third angle θ3 is less than 45° and the refractive index of the light path change structure 9 is less than 1, light may totally be reflected to the third subpixel area (not shown) adjacent to the right side of the first subpixel area 21 without entering the inclined surface, whereby image distortion or light spread may occur. Alternatively, if the third angle θ3 is less than 45° and the refractive index of the light path change structure 9 is less than 1, since light entering through the inclined surface 93, emitted through the top surface 91 is refracted to be biased toward the third subpixel area, image distortion or light spread may occur. If the third angle θ3 exceeds 70° and the refractive index of the light path change structure 9 exceeds 1.34, since light emitted through the top surface 91 is refracted to the second subpixel area 22, image distortion or light spread may occur. Therefore, the display device 1 according to the modified embodiment of the second embodiment of the present disclosure may change the light path to the first subpixel area 21 through the third angle θ3 and the refractive index of the light path change structure 9.

For example, if the third angle θ3 is 45° or more and less than 49° and the refractive index of the light path change structure 9 is 1 or more and 1.1 or less, a path of light entering through the inclined surface 93 of the light path change structure 9 may be changed to the first subpixel area 21 through the top surface 91 and then be emitted. In more detail, the light entering through the inclined surface 93 of the light path change structure 9 may be emitted to the first subpixel area 21 by primarily changing its path in accordance with a difference in refractive indexes between the encapsulation layer 10 and the light path change structure 9 and secondarily changing its path in accordance with a difference in refractive indexes between the light path change structure 9 and the encapsulation layer 10 on the top surface 91. In this case, if the third angle θ3 is less than 45° or 49° or more, image distortion or light spread may occur.

Likewise, if the third angle θ3 is 49° or more and less than 54° and the refractive index of the light path change structure 9 is 1.1 or more and 1.15 or less, light entering through the inclined surface 93 of the light path change structure 9 may be emitted to the first subpixel area 21 through the primary and secondary path changes.

Also, if the third angle θ3 is 54° or more and less than 65° and the refractive index of the light path change structure 9 is 1.15 or more and 1.3 or less, light entering through the inclined surface 93 of the light path change structure 9 may be emitted to the first subpixel area 21 through the primary and secondary path changes, and if the third angle θ3 is 65° or more and 70° or less and the refractive index of the light path change structure 9 is 1.3 or more and 1.34 or less, light entering through the inclined surface 93 of the light path change structure 9 may be emitted to the first subpixel area 21 through the primary and secondary path changes.

As a result, in the display device 1 according to the modified embodiment of the second embodiment of the present disclosure, the top surface 91 of the light path change structure 9 is spaced apart from the end of the second portion 82 of the second electrode 8 at the second spaced distance D2, and the incident light through the inclined surface 93 of the light path change structure 9 may be emitted to the first subpixel area 21 through the primary and secondary path changes based on the third angle θ3 ranging from 45° to 70° and the refractive index of the light path change structure 9 ranging from 1 to 1.34, whereby image distortion or light spread may be prevented from occurring in the first subpixel area 21.

Referring to FIG. 4A, in the display device 1 according to the third embodiment of the present disclosure, the light path change structure 9 may be formed of a reflective material to reflect light emitted from the organic light emitting layer 7 or light reflected by the first reflective electrode 41, thereby changing the light path. The reflective material may be formed of a material including metal, but is not limited to this. The reflective material may be formed of other materials as long as they can reflect light.

The light path change structure 9 of the display device 1 according to the third embodiment of the present disclosure may be provided to have the bottom surface 92 shorter than the second portion 82 of the second electrode 8 and the top surface 91 shorter than or equal to the bottom surface 92. Therefore, the light path change structure 9 may be formed with a trapezoidal shape or rectangular shape and its bottom surface 92 may have a length shorter than the length L1 of the second portion 82 of the second electrode 8. As shown in FIG. 4A, the bottom surface 92 of the light path change structure 9 may be spaced apart from the end of the second portion 82 of the second electrode 8 at a third spaced distance D3, wherein the third spaced distance D3 may range from 1 μm to 1.5 μm.

As shown in FIG. 4B, in the display device 1 according to a variant of the third embodiment of the present disclosure, the bottom surface 92 of the light path change structure 9 may be spaced apart from the end of the second portion 82 of the second electrode 8 at a fourth spaced distance D4, wherein the fourth spaced distance D4 may range from 0.5 μm to 1 μm.

The display device 1 according to a modified embodiment of the third embodiment of the present disclosure is the same as the display device according to the third embodiment of the present disclosure except a spaced distance for the bottom surface 92 spaced apart from the end of the second portion 82 of the second electrode 8 and a fourth angle θ4. Therefore, the same reference numbers are given to the same elements and only different elements will be described hereinafter.

If the bottom surface 92 of the light path change structure 9 is spaced apart from the end of the second portion 82 at less than 0.5 μm, since light is not reflected to the inclined surface 93 of the light path change structure 9 but reflected to the bottom surface of the light path change structure 9, a light path is formed toward the bank 6, whereby light emitted to the first subpixel area 21 is reduced and luminance may be reduced. If the bottom surface 92 of the light path change structure 9 is spaced apart from the end of the second portion 82 by exceeding 1.5 μm, light reflected by the first reflective electrode 41 may pass through the upper side of the light path change structure 9 without being reflected to the inclined surface 93 of the light path change structure 9. Therefore, since the light path change structure 9 cannot reflect the light, the light may move to the second subpixel area 22, whereby image distortion or light spread may occur. Therefore, in the display device 1 according to the third embodiment of the present disclosure, as the bottom surface 92 of the light path change structure 9 may be spaced from the end of the second portion 82 within the range between 0.5 μm to 1.5 μm, the light path change structure 9 may emit the light to the first subpixel area 21 by reflecting the light, whereby image distortion or light spread may be prevented from occurring gin the first subpixel area 21.

As shown in FIG. 4A, light emitted from the organic light emitting layer 7 of the first subpixel area 21 may partially enter the inside of the bank 6 and then be reflected by the first reflective electrode 41 and enter the inclined surface 93 of the light path change structure 9 through the bank top surface 61, the second portion 82 of the second electrode 8, and the encapsulation layer 10. The light reflected to the inclined surface 93 of the light path change structure 9 may be emitted to the first subpixel area 21 as shown in FIG. 4A. Since the light path change structure 9 of the display device 1 according to the third embodiment of the present disclosure is formed of a reflective material as described above, the fourth angle θ4 between the bottom surface 92 and the inclined surface 93 may be an important factor that may change the light path regardless of the refractive index. As the fourth angle θ4 is changed, the path of light reflected to the inclined surface 93 of the light path change structure 9 may be changed.

Referring to FIG. 4A, the fourth angle θ4 is 90° as an example, the light path change structure 9 may be a rectangular shape, and the third spaced distance D3 may range from 1 μm to 1.5 μm. Therefore, the light reflected by the first reflective electrode 41 may be reflected to the inclined surface 93 of the light path change structure 9 and then emitted to the first subpixel area 21. As the third spaced distance D3 gets smaller within the range above, the light reflected by the first reflective electrode 41 may be reflected to the inclined surface 93 close to the bottom surface 92 of the light path change structure 9. On the contrary, as the third spaced distance D3 gets larger within the range above, the light reflected by the first reflective electrode 41 may be reflected to the inclined surface 93 close to the top surface 91 of the light path change structure 9. Therefore, if the third spaced distance D3 is less than 1 μm, the light reflected by the first reflective electrode 41 may not be reflected to the inclined surface 93 but be reflected to the bottom surface 92, whereby luminance is deteriorated. If the third spaced distance D3 exceeds 1.5 μm, the light reflected by the first reflective electrode 41 passes through the upper side of the inclined surface 93 without being reflected to the inclined surface 93, whereby image distortion or light spread may occur.

As a result, in the display device 1 according to the third embodiment of the present disclosure, the bottom surface 92 of the light path change structure 9 is spaced apart from the end of the second portion 82 of the second electrode 8 at the third spaced distance D3, and the incident light reflected by the first reflective electrode 41 through the light path change structure 9 having the fourth angle θ4 ranging from 75° to 90° may be reflected and emitted to the first subpixel area 21, whereby image distortion or light spread may be prevented from occurring in the first subpixel area 21.

Referring to FIG. 4B, the fourth angle θ4 is 60° as an example, the light path change structure 9 may be a trapezoidal shape, and the fourth spaced distance D4 may range from 0.5 μm to 1 μm. Therefore, the light reflected by the first reflective electrode 41 may be reflected to the inclined surface 93 of the light path change structure 9 and then emitted to the first subpixel area 21. As the fourth spaced distance D4 gets smaller within the range above, the light reflected by the first reflective electrode 41 may be reflected to the inclined surface 93 close to the bottom surface 92 of the light path change structure 9. On the contrary, as the fourth spaced distance D4 gets larger within the range above, the light reflected by the first reflective electrode 41 may be reflected to the inclined surface 93 close to the top surface 91 of the light path change structure 9. Therefore, if the fourth spaced distance D4 is less than 0.5 μm, the light reflected by the first reflective electrode 41 may not be reflected to the inclined surface 93 but be reflected to the bottom surface 92, whereby luminance is deteriorated. If the fourth spaced distance D4 exceeds 1 μm, the light reflected by the first reflective electrode 41 passes through the upper side of the inclined surface 93 without being reflected to the inclined surface 93, whereby image distortion or light spread may occur.

As a result, in the display device 1 according to the modified embodiment of the third embodiment of the present disclosure, the bottom surface 92 of the light path change structure 9 is spaced apart from the end of the second portion 82 of the second electrode 8 at the fourth spaced distance D4, and the incident light reflected by the first reflective electrode 41 through the light path change structure 9 having the fourth angle θ4 ranging from 60° to 75° may be reflected and emitted to the first subpixel area 21, whereby image distortion or light spread may be prevented from occurring in the first subpixel area 21.

The respective embodiments of the display device 1 according to the present disclosure has been described based on that the encapsulation layer 10 is arranged between the light path change structure 9 and a color filter layer (not shown) if the color filter layer is formed on the encapsulation layer 10. However, the respective embodiments of the display device 1 are not limited to the above description, and the top surface 91 of the light path change structure 9 may be provided to be in contact with the color filter layer without the encapsulation layer 10 between the light path change structure 9 and the color filter layer.

If the encapsulation layer 10 is arranged between the top surface 91 of the light path change structure 9 and the color filter layer, water may be prevented from being permeated into the light path change structure 9 in the respective embodiments of the display device 1 according to the present disclosure, whereby lifespan of the display device may be increased.

If the encapsulation layer 10 is not arranged between the top surface 91 of the light path change structure 9 and the color filter layer, a cell gap which is the distance between the organic light emitting layer 7 and the color filter layer may be reduced in the respective embodiments of the display device 1 according to the present disclosure, whereby the light emitted from the corresponding subpixel area may be prevented from being emitted to a subpixel area adjacent to the corresponding subpixel area and therefore a color mixture may be avoided.

Figure 5A:
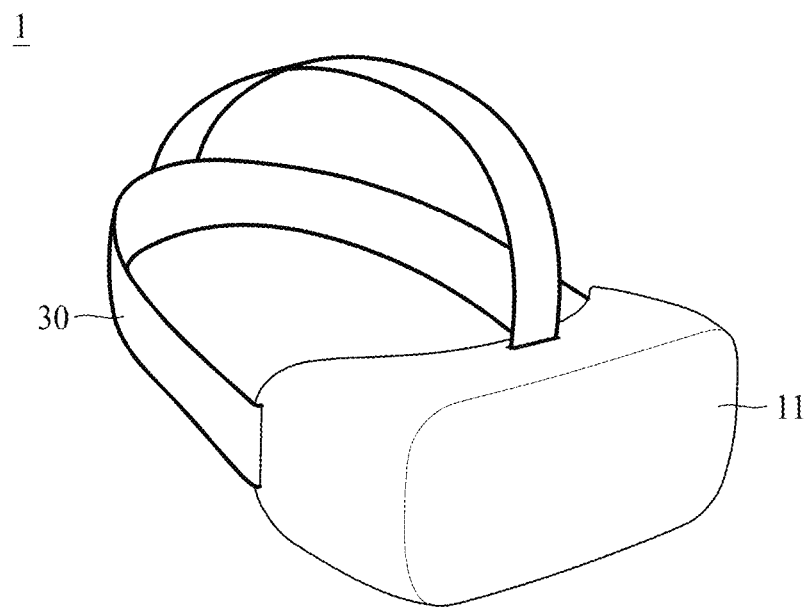
FIGS. 5A to 5C are views illustrating a display device according to another embodiment of the present disclosure, and relate to a head-mounted display (HMD) device.
Figure 5B:
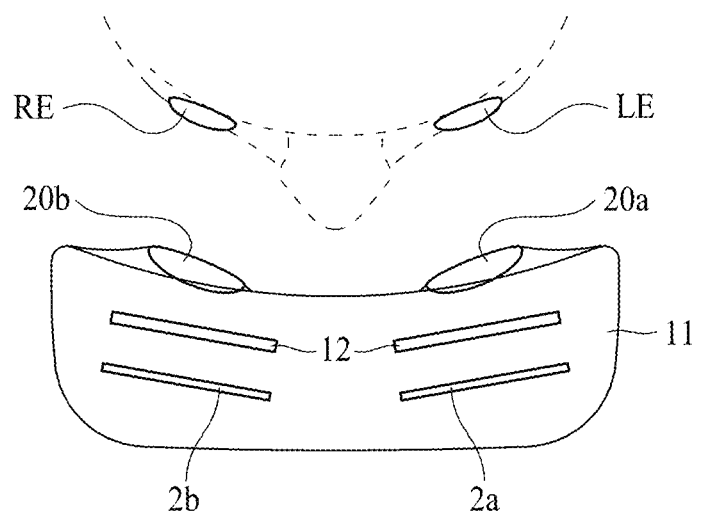
Figure 5C:
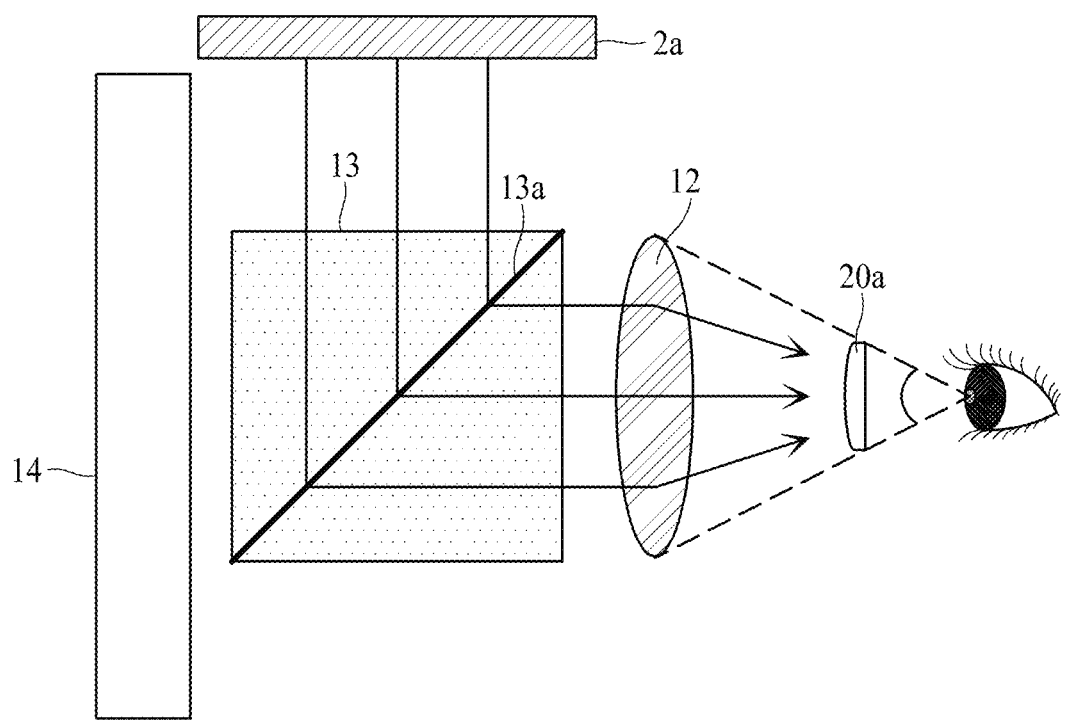

FIGS. 5A to 5C are views illustrating a display device according to another embodiment of the present disclosure and relate to a head mounted display (HMD) device. FIG. 5A is brief perspective view, FIG. 5B is a brief plane view of a virtual reality (VR) structure, and FIG. 5C is a brief cross-sectional view of an augmented reality (AR) structure.

As will be aware of it from FIG. 5A, a head mounted display device according to present disclosure comprises a storage case 11 and a head mounted band 30.

The storage case 11 stores elements such as a display device, a lens array, and an ocular lens.

The head mounted band 30 is fixed to the storage case 11. The head mounted band 30 is formed to surround a top surface and both sides of a user's head, but is not limited to this example. The head mounted band 30 is to fix a head mounted display to a user's head and may be replaced with a structure of a shape of a glasses frame or a helmet shape.

As will be aware of it from FIG. 5B, the head mounted display device 1 of a virtual reality (VR) structure according to the present disclosure may include a left eye display device 2a, a right eye display device 2b, a lens array 12, a left eye ocular lens 20a, and a right eye ocular lens 20b.

The left eye display device 2a, the right eye display device 2b, the lens array 12, the left eye ocular lens 20a and the right eye ocular lens 20b are stored in the storage case 11 described above.

The left eye display device 2a and the right eye display device 2b may display the same image, and in this case, a user may view 2D image. Alternatively, the left eye display device 2a may display a left eye image and the right eye display device 2b may display a right eye image, and in this case, a user may view a 3D image. Each of the left eye display device 2a and the right eye display device 2b may be comprised of a display device according to FIGS. 1 to 4B described above. For example, each of the left eye display device 2a and the right eye display device 2b may be an organic light emitting display device.

Each of the left eye display device 2a and the right eye display device 2b may include a plurality of subpixel areas, an insulating layer 3, a reflective electrode 4, a first electrode 5, a bank 6, an organic light emitting layer 7, a second electrode 8, and a light path change structure 9, and may display various images by combining colors of light emitted from each of the subpixel areas in various manners.

The lens array 12 may be provided between the left eye ocular lens 20a and the left eye display device 2a by being spaced apart from each of the left eye ocular lens 20a and the left eye display device 2a. That is, the lens array 12 may be arranged in front of the left eye ocular lens 20a and behind the left eye display device 2a. Also, the lens array 12 may be provided between the right eye ocular lens 20b and the right eye display device 2b by being spaced apparat from each of the right eye ocular lens 20b and the right eye display device 2b. That is, the lens array 12 may be arranged in front of the right eye ocular lens 20b and behind the right eye display device 2b.

The lens array 12 may be a micro lens array. The lens array 12 may be replaced with a pin hole array. Due to the lens array 12, images displayed on a left eye display device 2a or a right eye display device 2b may be viewed to be magnified to a user.

A left eye LE of a user may be arranged in the left eye ocular lens 20a, and a right eye RE of a user may be arranged in the right eye ocular lens 20b.

As will be aware of it from FIG. 5C, a head mounted display device of an AR structure according to the present disclosure includes a left eye display device 2a, a lens array 12, a left eye ocular lens 20a, a transmissive reflection portion 13, and a transmissive window 14. Although only a structure for a left eye is shown in FIG. 5C for convenience, a structure for a right eye is the same as the structure for the left eye.

The left eye display device 2a, the lens array 12, the left eye ocular lens 20a, the transmissive reflection portion 13, and the transmissive window 14 are stored in the aforementioned storage case 11.

The left eye display device 2a may be arranged at one side of the transmissive reflection portion 13, for example, at an upper side, without covering the transmissive window 14. Therefore, the left eye display device 2a may provide the transmissive reflection portion 13 with an image without covering an outer background viewed through the transmissive window 14.

The left eye display device 2a may be comprised of an electroluminescence display device according to FIGS. 1 to 4B described above. In this case, the top portion corresponding to the surface where images are displayed in FIGS. 1 to 4B, for example, the encapsulation layer 10 or the color filter layer (not shown) faces the transmissive reflection portion 13.

The lens array 12 may be provided between the left eye ocular lens 20a and the transmissive reflection portion 13.

A left eye of a user is arranged in the left eye ocular lens 20a.

The transmissive reflection portion 13 is arranged between the lens array 12 and the transmissive window 14. The transmissive reflection portion 13 may include a reflection surface 13a which transmits a portion of light and reflects another portion of light. The reflection surface 13a is formed to make an image displayed on the left eye display device 2a to proceed to the lens array 12. Therefore, a user may view all of images displayed on the left eye display device 2a and an outer background through the transmissive window 14. That is, since the user may view one image by overlapping background in reality with virtual images, augmented reality (AR) may be embodied.

The transmissive window 14 is arranged in front of the transmissive reflection portion 13.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a substrate having a first subpixel area and a second subpixel area adjacent to one side of the first subpixel area;

an insulating layer on the substrate having a first recessed portion on the first subpixel area, a second recessed portion on the second subpixel area and a convex portion between the first recessed portion and the second recessed portion;
a reflective electrode on the insulating layer, including a first reflective electrode on the first recessed portion and a second reflective electrode on the second recessed portion;
a first electrode including a first sub electrode on the first reflective electrode and a second sub electrode on the second reflective electrode;
an organic light emitting layer on the first electrode;
a bank between the first subpixel area and the second subpixel area covering an end of the first electrode;
a second electrode on the organic light emitting layer; and
a light path change structure arranged on the second electrode while being overlapped with the bank.

2. The display device of claim 1, wherein the light path change structure has a refractive index smaller than that of the bank.

3. The display device of claim 1, wherein the light path change structure includes a top surface, a bottom surface longer than the top surface in a longitudinal direction, an inclined surface connecting the top surface with the bottom surface.

4. The display device of claim 1, wherein the light path change structure includes a top surface, a bottom surface shorter than the top surface in a longitudinal direction, an inclined surface connecting the top surface with the bottom surface.

5. The display device of claim 1, wherein the light path change structure is formed of a reflective material.

6. The display device of claim 1, wherein the light path change structure includes a top surface, a bottom surface equal to the top surface in length in a longitudinal direction, an inclined surface connecting the top surface with the bottom surface.

7. The display device of claim 1, wherein each of the first recessed portion and the second recessed portion includes a recessed bottom surface and a recessed side surface connecting the recessed bottom surface with a convex top surface of the convex portion, wherein each of the first reflective electrode and the second reflective electrode covers only a portion of the convex top surface.

8. The display device of claim 2, further comprising an encapsulation layer on the second electrode, and the refractive index of the light path change structure is smaller than that of the encapsulation layer.

9. The display device of claim 3, wherein the second electrode includes a first portion on a relatively low position while being overlapped with the first electrode, a second portion on a relatively high position while being overlapped with the bank, and a third portion connecting the first portion with the second portion, and an end of the bottom surface of the light path change structure is aligned with that of the second portion of the second electrode.

10. The display device of claim 9, wherein the inclined surface of the light path change structure has a first angle with the bottom surface, and the first angle ranges from 45° to 55°.

11. The display device of claim 10, wherein the first angle is 45° or more and less than 48°, and the refractive index of the light path change structure is 1.05 or more and 1.15 or less, or the first angle is 48° or more and less than 52°, and the refractive index of the light path change structure is 1.15 or more and 1.25 or less, or
the first angle is 52° or more and 55° or less, and the refractive index of the light path change structure is 1.25 or more and 1.35 or less.

12. The display device of claim 4, wherein the second electrode includes a first portion on a relatively low position while being overlapped with the first electrode, a second portion on a relatively high position while being overlapped with the bank, and a third portion connecting the first portion with the second portion, the top surface of the light path change structure is shorter than the second portion of the second electrode in a longitudinal direction, and the top surface of the light path change structure is spaced apart from an end of the second portion of the second electrode within a range between 0.5 μm and 1 μm.

13. The display device of claim 4, wherein the second electrode includes a first portion on a relatively low position while being overlapped with the first electrode, a second portion on a relatively high position while being overlapped with the bank, and a third portion connecting the first portion with the second portion, the top surface of the light path change structure is shorter than the second portion of the second electrode in a longitudinal direction, and the top surface of the light path change structure is spaced apart from an end of the second portion of the second electrode within a range between 0 μm and 0.5 μm.

14. The display device of claim 12, wherein the top surface of the light path change structure has a second angle with the inclined surface, and the second angle ranges from 55° to 70°.

15. The display device of claim 14, wherein the second angle is 55° or more and less than 59°, and the refractive index of the light path change structure is 1.05 or more and 1.25 or less, or
the second angle is 59° or more and less than 65°, and the refractive index of the light path change structure is 1.25 or more and 1.3 or less, or
the second angle is 65° or more and 70° or less, and the refractive index of the light path change structure is 1.3 or more and 1.34 or less.

16. The display device of claim 13, wherein the top surface of the light path change structure has a third angle with the inclined surface, and the third angle ranges from 45° to 70°.

17. The display device of claim 16, wherein the third angle is 45° or more and less than 49°, and the refractive index of the light path change structure is 1 or more and 1.1 or less, or
the third angle is 49° or more and less than 54°, and the refractive index of the light path change structure is 1.1 or more and 1.15 or less, or
the third angle is 54° or more and less than 65°, and the refractive index of the light path change structure is 1.15 or more and 1.3 or less, or
the third angle is 65° or more and 70° or less, and the refractive index of the light path change structure is 1.3 or more and 1.34 or less.

18. The display device of claim 5, wherein the second electrode includes a first portion on a relatively low position while being overlapped with the first electrode, a second portion on a relatively high position while being overlapped with the bank, and a third portion connecting the first portion with the second portion, the bottom surface of the light path change structure is shorter than the second portion of the second electrode in a longitudinal direction, and the top surface of the light path change structure is shorter than or equal to the bottom surface in length in a longitudinal direction.

19. The display device of claim 18, wherein the bottom surface of the light path change structure is spaced apart from an end of the second portion of the second electrode within a range between 0.5 μm and 1.5 μm.

20. The display device of claim 19, wherein the bottom surface of the light path change structure has a fourth angle with the inclined surface, and the fourth angle ranges from 60° to 90°.

* * * * *